(12) United States Patent
Bradley, II

(10) Patent No.: US 8,624,577 B2
(45) Date of Patent: Jan. 7, 2014

(54) IDENTIFYING A CABLE PATH USING LIGHT EMITTING DIODES

(75) Inventor: Charles B. Bradley, II, Largo, FL (US)

(73) Assignee: Raytheon Company, Waltham, MA (US)

( * ) Notice: Subject to any disclaimer, the term of this patent is extended or adjusted under 35 U.S.C. 154(b) by 438 days.

(21) Appl. No.: 12/900,861

(22) Filed: Oct. 8, 2010

(65) Prior Publication Data

US 2012/0086428 A1    Apr. 12, 2012

(51) Int. Cl.
*G01R 19/00* (2006.01)

(52) U.S. Cl.
USPC ............ 324/66; 324/67; 324/208; 324/379; 324/439; 324/508; 324/713; 200/51.07; 200/51.12; 379/1.01; 379/9; 379/14; 379/14.01

(58) Field of Classification Search
USPC .............. 324/66, 379, 439, 208, 508, 713
See application file for complete search history.

(56) References Cited

U.S. PATENT DOCUMENTS

| | | | | |
|---|---|---|---|---|
| 1,738,710 A | * | 12/1929 | Jones | 324/66 |
| 5,764,043 A | * | 6/1998 | Czosnowski et al. | 324/66 |
| 5,847,557 A | * | 12/1998 | Fincher et al. | 324/66 |
| 6,710,254 B2 | * | 3/2004 | Yueh | 174/135 |
| 6,750,643 B2 | * | 6/2004 | Hwang et al. | 324/66 |
| 7,038,135 B1 | * | 5/2006 | Chan et al. | 174/84 R |
| 7,307,408 B2 | | 12/2007 | Porcu et al. | 324/66 |
| 7,393,237 B2 | | 7/2008 | Kuo | 439/490 |
| 7,473,020 B2 | | 1/2009 | Pickering | 362/612 |
| 7,544,909 B2 | * | 6/2009 | Dhir | 200/51.12 |
| 2009/0278524 A1 | * | 11/2009 | Calcaterra et al. | 324/66 |

* cited by examiner

*Primary Examiner* — Arleen M Vazquez
*Assistant Examiner* — Giovanni Astacio-Oquendo
(74) *Attorney, Agent, or Firm* — Thorpe North & Western LLP

(57) ABSTRACT

In one embodiment, a system for identifying a cable path may be provided. The system may include a cable set operable to transmit data, the cable set comprising power delivery wires designed to transmit electrical power. The cable set may also comprise two adapters proximate respective ends of the cable set, the first adapter operable to be coupled to a signal generator operable to transmit electrical power across the power delivery wires. In some embodiments, the cable set may further comprise a circuit coupled to the power delivery wires of the cable set, the circuit operable to receive electrical power from the signal generator and allow at least a portion of the electrical power to continue across the power delivery wires. The cable set may further comprise an indicator coupled to the circuit and operable to emit light when electrical power from the circuit is received at the indicator.

20 Claims, 3 Drawing Sheets

US 8,624,577 B2

IDENTIFYING A CABLE PATH USING LIGHT EMITTING DIODES

TECHNICAL FIELD

This invention relates generally to the field of cable path identification and more specifically to identifying a cable path using light emitting diodes.

BACKGROUND

A network may include a myriad of cables. In some instances, a first end of a cable may become disconnected from its destination device. A user may not be able to readily determine the location (and the point of connection) of the second end of the cable. For example, the cable path may go through a wall, ceiling, or floor, or the cable may be bundled with other cables such that it is very difficult to trace the path of the particular cable.

SUMMARY OF THE DISCLOSURE

In accordance with the present invention, disadvantages and problems associated with previous techniques for identification of a cable path using light emitting diodes may be reduced or eliminated.

In one embodiment, a system for identification of a cable path may include a cable set operable to transmit data. The cable set may comprise power delivery wires designed to transmit electrical power. The cable set may also comprise two adapters proximate respective ends of the cable set, where the first adapter is operable to be coupled to a signal generator operable to transmit electrical power across the power delivery wires. In some embodiments, the cable set may further comprise a circuit coupled to the power delivery wires of the cable set. The circuit may be operable to receive electrical power from the signal generator and allow at least a portion of the electrical power to continue across the power delivery wires. The cable set may further comprise an indicator coupled to the circuit and operable to emit light when electrical power from the circuit is received at the indicator.

Certain embodiments of the invention may provide one or more technical advantages. A technical advantage of one embodiment may be that a cable may have indicators that emit light along the cable path. This may allow a user to trace a cable path without the help of another user.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1-4 of the drawings, like numerals being used for like and corresponding parts of the various drawings.

Figure 1:
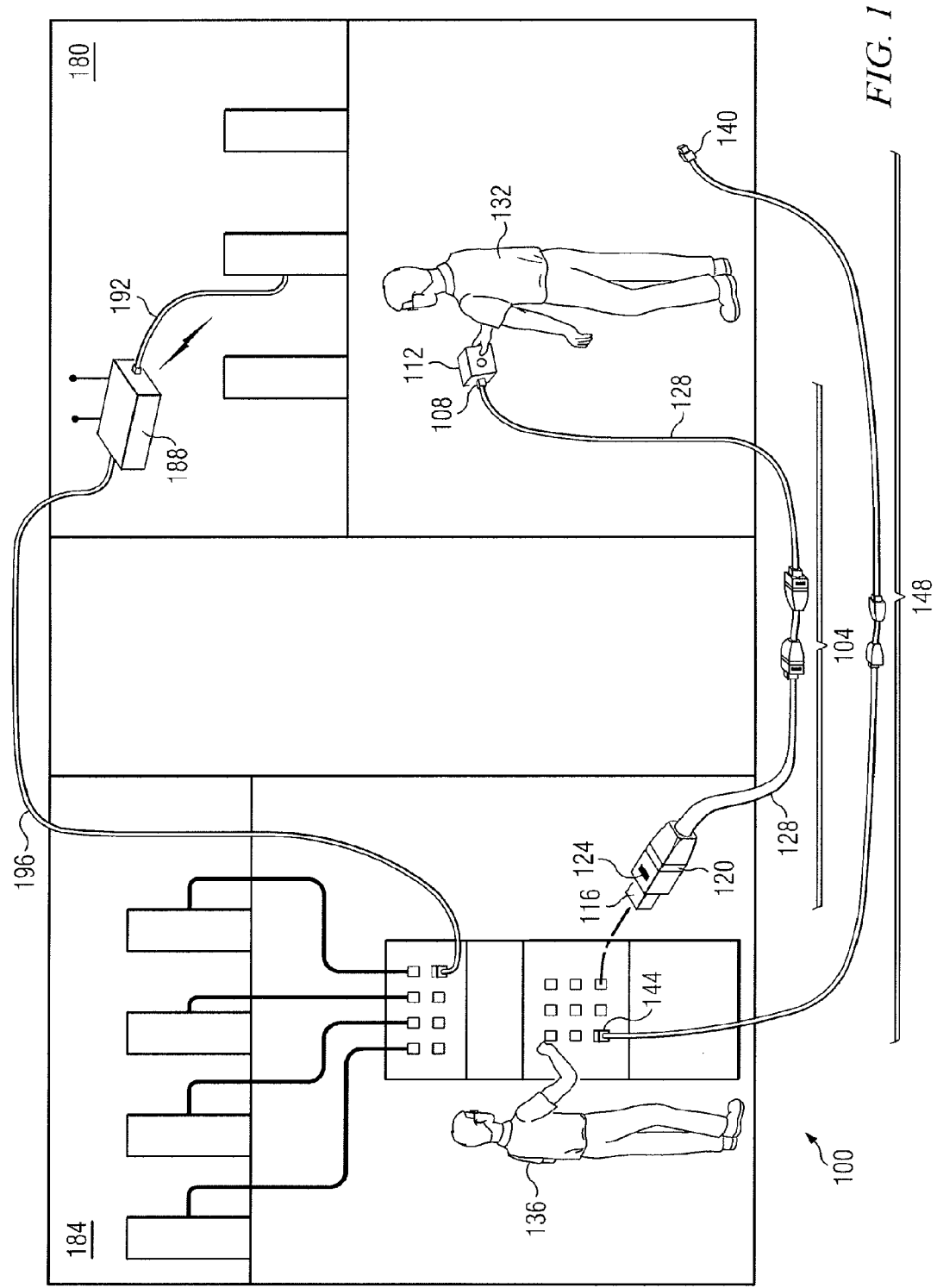
FIG. 1 depicts an example of a system for identification of a cable path using light emitting diodes.

FIG. 1 depicts an example of a system 100 for identification of a cable path using light emitting diodes. In some embodiments, the system 100 may include a cable set 104 operable to transmit data. In some embodiments, the cable set 104 may comprise at least one pair of power delivery wires designed to transmit electrical power. The cable set 104 may also comprise a first adapter 108 proximate a first end of the cable set, where the first adapter is operable to be coupled to a signal generator 112. The signal generator 112 may be operable to transmit electrical power across the power delivery wires. The cable set may comprise a second adapter 116 proximate a second end of the cable set 104. In some embodiments, the cable set 104 may further comprise a circuit 120 coupled to the power delivery wires of the cable set. The circuit may be operable to receive electrical power from the signal generator 112 and allow at least a portion of the electrical power to continue across the power delivery wires. The cable set 104 may further comprise an indicator 124 coupled to the circuit 120 and operable to emit light when electrical power from the circuit is received at the indicator.

In some embodiments, a user 132 may encounter a cable set (such as 148) with a loose (e.g., unplugged) end 140 in a room 180. The user 132 may not be able to readily identify the cable path of the cable set 148. For example, the cable path may go through a wall, ceiling, or floor, the cable set may be bundled with other cables, or the cable path may end in another room 184. In such situations, it may be extremely difficult to trace the path of the cable set. Such situations may hinder or prevent a user 132 from discovering the location of the other end 144 of the cable set 148. This may be problematic, since it is generally desirable to know what one end of a cable is connected to before connecting the other end. In some situations, the cable path may not be identifiable without help from another user 136. For example, if a portion of the cable path is not visible, a user 132 may have to tug on the cable set 148 while another user 136 attempts to identify which cable set is being displaced by user 132.

In the embodiment depicted, system 100 includes a cable set 104 that includes one or more indicators 124. An indicator 124 may be any device capable of converting electrical power into light and/or sound. In some embodiments, an indicator 124 may be a light emitting diode (LED), a light bulb, a buzzer, or other suitable light or noise source. In some embodiments, the indicators 124 of a cable set 104 may be operable to illuminate the cable path of the cable set when power from a signal generator 112 is received.

A cable set 104 may comprise one or more cables 128 operable to transmit data and power. For example, cable 128 may be an Ethernet cable (such as Category 3, 5, 5E, 6, or 7), a telephone cable, a Universal Serial Bus (USB) cable, or other suitable cable. In some embodiments, a cable set may comprise a plurality of cables connected in series. In some embodiments, the cable set comprises a first adapter 108 that may be coupled to a signal generator 112. The signal generator may be operable to transmit power through the cable set 104 (e.g., through wires of the cable set) to the indicators 124 of the cable set 104. The indicators 124 are operable to emit light and/or sound when the power is received. The light and/or sound emitted by the indicators may allow a user 132 to easily trace the cable path and/or identify the other end of the cable set 104. In some embodiments, the cable set 104 of system 100 may allow a user 132 to identify a cable path without help from another user 136. For example, a user 132 may plug adapter 108 into signal generator 112, set the signal generator down, and identify the cable path by viewing the lights (or listening to sound) from the indicators 124.

Figure 2:
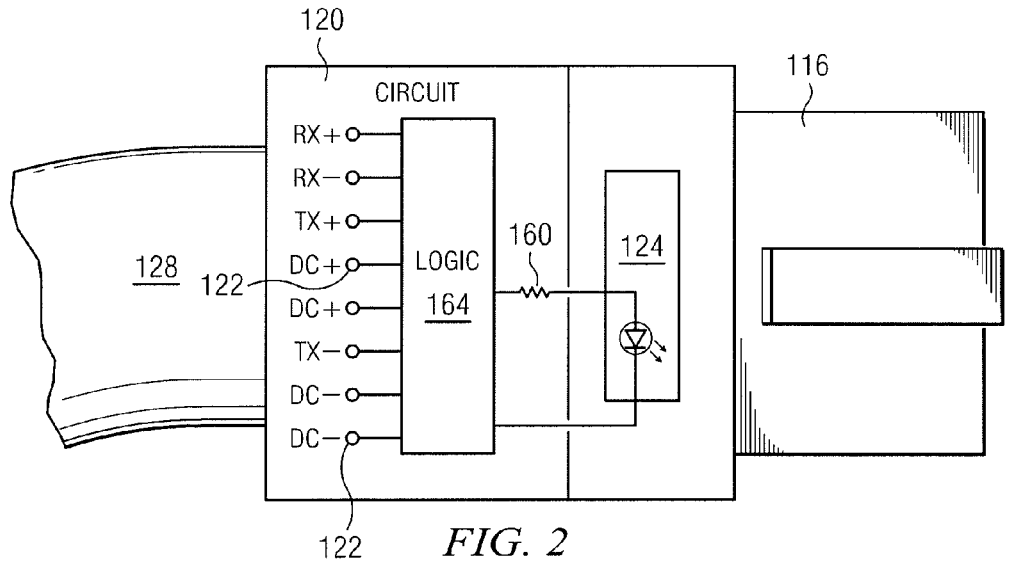
FIG. 2 depicts an example of a cable, adapter, indicator, and circuit that may be used in the system.

FIG. 2 depicts an example of a cable 128, adapter 116, indicator 124, and circuit 120 that may be used in system 100. In the depicted embodiment, the circuit 120 and indicator 124 are shown adjacent to the adapter 116. In some embodiments, the circuit 120 and/or indicator 124 may be placed at any suitable location along the length of cable 128.

In the embodiment depicted, the wires of cable 128 may be coupled to contacts (such as 122) of circuit 120. As shown, cable 128 may comprise at least one pair of power delivery wires (coupled to contacts 122) designed to transmit electrical power. For example, in some embodiments, the power delivery wires may have been previously assigned by a standards making organization, such as the Institute of Electrical and Electronics Engineers (IEEE), to carry electrical power. As an example, in some embodiments, cable 128 may comprise an Ethernet cable that conforms to a Power over Ethernet standard. A Power over Ethernet standard specifies standards for transmitting data and power in an Ethernet chord. For example, the IEEE 802.3af and IEEE 802.3at standards are Power over Ethernet standards. In the embodiment depicted, the cable 128 conforms to the IEEE 802.3af (mode B) standard. Under this standard, wires 4, 5, 7, and 8 (coupled to the contacts labeled "DC+" and "DC−") are assigned to carry electrical power. In other embodiments, a pair of wires used to transmit data may also be used to transmit power. For example, in IEEE 802.3af (mode A), wires 1, 2, 3, and 6 are assigned to carry both electrical power and data signals. In some embodiments, a data signal may be superimposed on a direct current (DC) power signal and transmitted across cable 128.

In some embodiments, cable set 104 may comprise one or more adapters 108 proximate one or more ends of a cable 128. An adapter 116 may be any suitable apparatus operable to couple one or more wires of a cable 128 to another apparatus. For example, in some embodiments, adapter 116 may be operable to couple the wires of cable 128 to another adapter, a signal generator 112, and/or the wires of another cable 128. In some embodiments, an adapter 116 may be an Ethernet adapter (such as a Registered Jack 45 (RJ45) or similar connector), a telephone wire adapter, a USB adapter, or other suitable adapter.

In some embodiments, an indicator 124 may be coupled to circuit 120 and may be operable to emit light and/or sound when electrical power from the circuit is received at the indicator. In some embodiments, indicator 124 may comprise a light emitting diode (LED) or other suitable device operable to convert electrical power to light. In some embodiments, any suitable color of light may be emitted by the indicator. For example, the indicator may emit white, blue, red, or other color of light. In some embodiments, the shape of the indicator may be any suitable shape. In some embodiments, the indicator 124 may be operable to emit light and/or sound in response to receiving DC and/or Alternating Current (AC) electrical power. In some embodiments, the indicator 124 may emit light and/or sound intermittently when the electrical power is received.

In some embodiments, one or more circuits 120 may be coupled to the power delivery wires of the cable set 104. In the embodiment depicted, circuit 120 is coupled to each wire of cable 128 through contacts (such as 122). In some embodiments, circuit 120 may be coupled to a subset of the wires of cable 128. Circuit 120 may be operable to receive electrical power from the signal generator 112 and allow at least a portion of the electrical power to continue across the power delivery wires. For example, a portion of the current produced by signal generator 112 may be diverted from the power delivery wires and/or dissipated by circuit 120 while the remaining current is allowed to flow across the power delivery wires. In some embodiments, the circuit 120 may pass a portion of the electrical power received to indicator 124. In some embodiments, the circuit 120 may limit the amount of electrical power passed to the indicator 124. For example, the circuit 120 may include a current limiting device, such as resistor 160, in order to protect the indicator 124. In some embodiments, the indicator 124 may include a current limiting device.

In some embodiments, the circuit 120 may be operable to perform various functions using logic 164. For example, in some embodiments, circuit 120 may be operable to distinguish between a power signal received from signal generator 112 and a power signal received from a power supply device that transmits power according to a predetermined power supply standard. A power supply standard may specify a voltage, current, and/or other characteristic of power. As an example, IEEE 802.3af specifies a voltage range of 37.0-47.0 V for power received at a powered device. In some embodiments, circuit 120 may be operable to sense a voltage level, current level, and/or other characteristic of the power signal to determine whether it conforms to a power supply standard or is from signal generator 112.

In some embodiments, if the cable set 104 is coupled between two devices that exchange power conforming to a power supply standard, such as a Power over Ethernet standard, it may be desirable to disconnect an indicator 124 from the power signal in order to preserve power for the powered device and/or protect the indicators 124 from excessive current. In some embodiments, the circuit 120 may be operable to prevent all or a portion of the electrical power received at the circuit from reaching the indicator 124. For example, the circuit may cut off the electrical power to the indicator 124 if the power conforms to a predetermined power supply standard, such as a Power over Ethernet standard.

As another example, circuit 120 may be operable to filter one or more signals received from the signal generator 112. For example, the circuit 120 may receive a data signal on a pair of wires that is designed to carry data and power. In order to avoid power loss or other undesirable effects, the circuit 120 may filter the data signal so that only the power signal is passed to the indicator 124.

As another example, circuit 120 may be operable to detect which pair(s) of wires are being used to transmit a power signal and use these pairs to receive the power signal and transfer power to the indicator 124. For example, the circuit 120 may check a pair of wires for a DC voltage within a given range before transmitting the power received from the pair of wires to the indicator 124.

Figure 3:
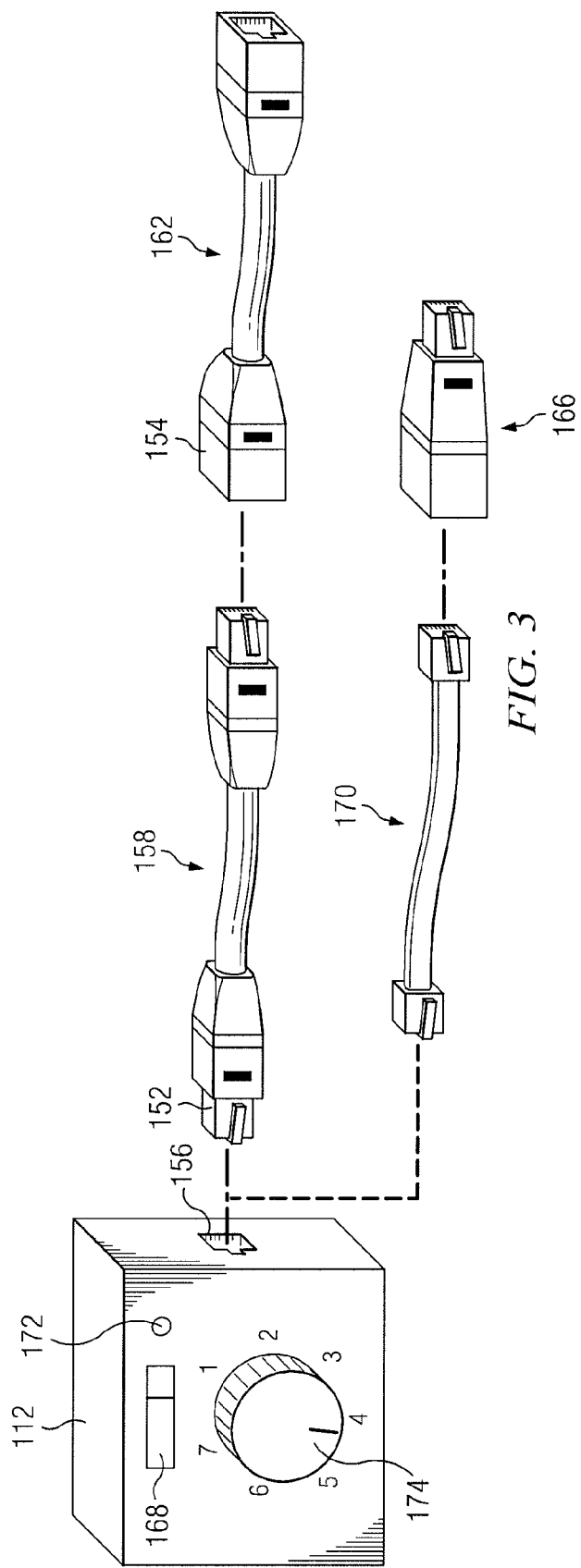
FIG. 3 depicts an example of a signal generator and various cables that may be used in the system.

FIG. 3 depicts an example of a signal generator 112 and various cables 158, 162, 166, and 170 that may be used in the system. In some embodiments, a signal generator 112 may have a port 156 that is operable to be coupled to an adapter 108 of the cable set 104. A port 156 may comprise any suitable apparatus for coupling one or more wires of a cable 128 to the signal generator 112. For example, a port may comprise a female Ethernet adapter or other suitable adapter.

In some embodiments, the signal generator 112 may also comprise a power supply that is operable to supply electrical power to a cable set 104. In some embodiments, the power supply may provide DC and/or AC power to one or more pairs of wires of cable set 104. In some embodiments, the power supply may comprise one or more batteries, such as alkaline, lithium-ion, nickel-cadmium, or other suitable batteries. In other embodiments, the power supply may comprise a transformer and/or rectifier to convert power from an electrical outlet to a form suitable for transmission through the cable set 104.

In some embodiments, signal generator 112 may comprise various inputs and/or indicators. In some embodiments, signal generator 112 may comprise switch 168 that controls whether electrical power is transmitted through cable set 104. In some embodiments, signal generator 112 may comprise an interval control 174 that controls the length of a repeating interval over which electrical power is transmitted through cable set 104. In some embodiments, the maximum interval setting may result in constant power transmission through the cable set 104. In some embodiments, signal generator 112 may comprise one or more indicators 172 that emit light. For example, in an embodiment, indicator 172 may glow when switch 168 is activated. In other embodiments, indicator 172 may glow when the signal generator 112 senses that a cable set 104 has been connected to the signal generator and/or electrical power is being transmitted through the cable set.

In some embodiments, the signal generator 112 may be a hand-held device. In some embodiments, the signal generator 112 may be a computing device, such as a laptop, operable to control transmission of electrical power through the cable set 104. In some embodiments, the computing device may include software that allows a user 132 to control characteristics of the transmitted electrical power, such as when and/or how electrical power is transmitted through the cable set 104. For example, the software may allow a user 132 to set the voltage, maximum current, and/or other characteristics of the power signal transmitted through cable set 104. In some embodiments, the software may allow a user 132 to enable and disable the transmission of the power. In some embodiments, the software may allow a user to specify a repeatable interval over which power is transmitted.

In some embodiments, a cable set 104 may comprise cables with various adapter configurations. In some embodiments, a cable of a cable set 104 may comprise one or more male adapters 152 and/or one or more female adapters 154. For example, cables 158 and 170 have two male adapters each, and cable 166 has one male adapter. As another example, cable 162 has two female adapters and cable 166 has one female adapter. In some embodiments, a male adapter 152 may be operable to be coupled to a female adapter of a signal generator 112.

In some embodiments, zero, one, or more of the adapters of a cable may be coupled to an indicator 124. For example, both adapters of cables 158 and 162 are coupled to indicators 124, but neither adapter of cable 170 is coupled to an indicator. In some embodiments, a cable 166 may be attached to a cable 170 and/or another cable that does not include an indicator 124. Such embodiments may enable the tracing of the cable path of a cable set 104 that includes one or more cables that do not include indicators 124.

Referring again to FIG. 1, in some embodiments, an adapter of a cable set 192 may be coupled to a networking device 188. A networking device may be any device operable to mediate data in a computer network. For example, a networking device may comprise a gateway, router, bridge, switch, hub, repeater, or other suitable device. In general, networking devices are not designed to pass electrical power between two cable sets connected through the networking device (rather they are designed to transmit data between the cable sets). In some embodiments, a networking device is operable to allow electrical power from a signal generator 112 to pass from one cable set 192 connected to the networking device 188 to another cable set 196 also connected to the networking device. In some embodiments, the networking device 188 may be operable to distinguish between electrical power received from signal generator 112 and electrical power that conforms to a power supply standard, such as a Power over Ethernet standard. The networking device 188 may be operable to allow power received from a signal generator 112 to pass from one cable set 192 to another cable set 196, but prevent the transfer if the power conforms to the power supply standard.

Figure 4:
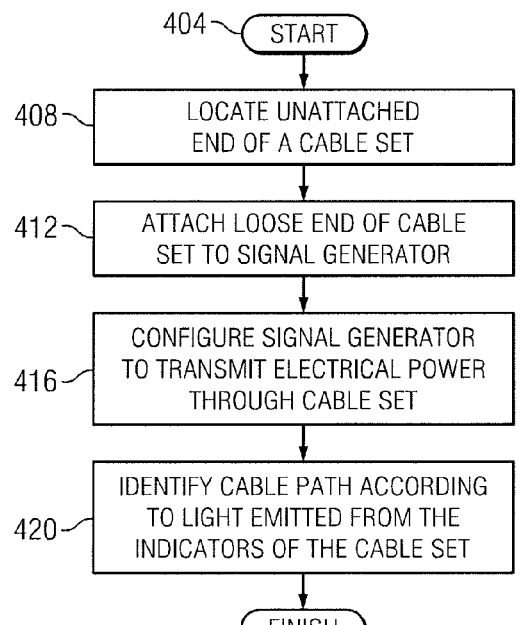
FIG. 4 depicts an example of a method for identifying a cable path using light emitting diodes.

FIG. 4 depicts an example of a method for identifying a cable path using light emitting diodes. The method begins at step 404. At step 408, a user 132 locates an unattached end of a cable set 104. A user attaches adapter 108 at the loose end of the cable set to a signal generator 112 at step 412. At step 416, the user configures the signal generator 112 to transmit electrical power through the cable set 104. For example, the user may configure a hand-held signal generator to transmit the electrical power or the user may configure the software of a computing device to transmit the electrical power. At step 420, the user identifies the cable path by viewing the light emitted from the indicators 124 of the cable set. The method ends at step 424.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The method may include more, fewer, or other steps.

A component of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A system, comprising:
   a signal generator operable to transmit electrical power configured as a signal; and
   a cable set operable to transmit data and to be selectively coupled to the signal generator, the cable set comprising:
      at least one pair of power delivery wires operable to transmit electrical power;
      a first adapter proximate a first end of the cable set, the first adapter operable to be coupled to the signal generator to transmit the signal across the power delivery wires;
      a logic circuit coupled to the power delivery wires of the cable set; and
      an indicator coupled to the logic circuit and operable to emit light,
   wherein the logic circuit is operable to:
      receive electrical power from the power delivery wires,
      allow at least a portion of the electrical power to continue across the power delivery wires,
      identify the signal from the signal generator, and
      pass a portion of the electrical power to the indicator, upon identification of the signal, to cause the indicator to emit light.

2. The system of claim 1, the circuit operable to:
   prevent the electrical power from reaching the indicator if the electrical power received at the circuit conforms to a predetermined power supply standard.

3. The system of claim 1, the signal generator comprising a hand-held device that transmits the electrical power from one or more batteries.

4. The system of claim 1, the signal generator comprising a computing device operable to control transmission of the electrical power through the at least one pair of power delivery wires.

5. The system of claim 1, the cable set comprising an Ethernet cable that conforms to a Power over Ethernet standard.

6. The system of claim 1, further comprising:
   a second adapter proximate a second end of the cable set, the second adapter comprising a male Ethernet adapter coupled to the circuit.

7. The system of claim 1, the cable operable to be coupled to a networking device that allows at least a part of the electrical power to pass through the networking device to a second cable set coupled to the networking device.

8. A system, comprising:
   a signal generator operable to transmit electrical power configured as a signal and having a female Ethernet adapter; and
   an Ethernet cable set operable to be selectively coupled to the signal generator and implement a Power over Ethernet standard, the Ethernet cable set comprising:
      two pairs of power delivery wires operable to transmit direct current (DC) electrical power;
      a first Ethernet adapter proximate a first end of the Ethernet cable set, the first Ethernet adapter operable to be coupled to the female Ethernet adapter of the signal generator to transmit the signal across the power delivery wires;
      a logic circuit coupled to the power delivery wires of the cable set; and
      a light emitting diode (LED) coupled to the logic circuit and operable to emit light,
   wherein the logic circuit is operable to:
      receive electrical power from the power delivery wires,
      allow at least a portion of the electrical power to continue across the power delivery wires,
      identify the signal from the signal generator, and
      pass a portion of the electrical power to the LED, upon identification of the signal, to cause the LED to emit light.

9. The system of claim 8, the circuit operable to:
   prevent the DC electrical power from reaching the LED if the DC electrical power received at the circuit conforms to the Power over Ethernet standard.

10. The system of claim 8, the signal generator comprising a hand-held device that transmits the DC electrical power from one or more batteries.

11. The system of claim 8, the signal generator comprising a computing device operable to control transmission of the DC electrical power through at least one pair of the power delivery wires.

12. The system of claim 8, the system further comprising:
    a second Ethernet adapter proximate a second end of the Ethernet cable set, the second Ethernet adapter comprising a male Ethernet adapter coupled to the circuit.

13. The system of claim 8, the Ethernet cable set operable to be coupled to a networking device that allows at least a part of the DC electrical power to pass through the networking device to a second Ethernet cable set coupled to the networking device.

14. A system, comprising:
    a signal generator comprising:
       a port; and
       a power supply operable to supply electrical power configured as a signal through the port; and
    a cable set operable to be selectively coupled to the signal generator, the cable set comprising:
       at least one pair of power delivery wires operable to transmit electrical power;
       a first adapter proximate a first end of the cable set, the first adapter operable to be coupled to the signal generator via the port to couple the signal generator to the cable set;
       a logic circuit coupled to the power delivery wires of the cable set; and
       an indicator coupled to the logic circuit and operable to emit light,
    wherein the logic circuit is operable to:
       receive electrical power from the power delivery wires,
       allow at least a portion of the electrical power to continue across the power delivery wires,
       identify the signal from the signal generator, and
       pass a portion of the electrical power to the indicator, upon identification of the signal, to cause the indicator to emit light.

15. The system of claim 14, the circuit operable to:
prevent the electrical power from reaching the indicator if the electrical power received at the circuit conforms to a predetermined power supply standard.

16. The system of claim 14, the signal generator comprising a hand-held device that transmits the electrical power from one or more batteries.

17. The system of claim 14, the signal generator comprising a computing device operable to control transmission of the electrical power through the at least one pair of power delivery wires.

18. The system of claim 14, the cable set comprising an Ethernet cable that conforms to a Power over Ethernet standard.

19. The system of claim 14, further comprising:
a second adapter proximate a second end of the cable set, the second adapter comprising a male Ethernet adapter coupled to the circuit.

20. The system of claim 14, the cable operable to be coupled to a networking device that allows at least a part of the electrical power to pass through the networking device to a second cable set coupled to the networking device.

\* \* \* \* \*